(12) United States Patent
Umehara et al.

(10) Patent No.: US 11,831,055 B2
(45) Date of Patent: Nov. 28, 2023

(54) FUEL CELL SYSTEM

(71) Applicant: TOYOTA JIDOSHA KABUSHIKI KAISHA, Toyota (JP)

(72) Inventors: Takahiro Umehara, Susono (JP); Nobuyuki Kitamura, Yamanashi-ken (JP); Masayuki Ito, Shizuoka-ken (JP); Tomohiko Kaneko, Yokohama (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 16 days.

(21) Appl. No.: 17/654,171

(22) Filed: Mar. 9, 2022

(65) Prior Publication Data

US 2022/0293981 A1  Sep. 15, 2022

(30) Foreign Application Priority Data

Mar. 10, 2021 (JP) .................................. 2021-038185
Oct. 21, 2021 (JP) .................................. 2021-172292

(51) Int. Cl.
*H01M 8/04* (2016.01)
*H01M 8/04858* (2016.01)
*B60L 53/22* (2019.01)
*H01M 8/04537* (2016.01)

(52) U.S. Cl.
CPC ......... *H01M 8/04873* (2013.01); *B60L 53/22* (2019.02); *H01M 8/04641* (2013.01); *H01M 2250/20* (2013.01)

(58) Field of Classification Search
CPC ......... H01M 8/04873; H01M 8/04552; H01M 8/0488; H01M 8/04888; H01M 8/04932; H01M 8/04902; H01M 8/04952; H01M 8/04619; H01M 2250/20; B60L 53/22
See application file for complete search history.

(56) References Cited

U.S. PATENT DOCUMENTS

| 8,263,275 B2 * | 9/2012 | Manabe | H01M 8/0488 402/65 |
| 2010/0013490 A1 | 1/2010 | Manabe et al. | |
| 2012/0074919 A1 * | 3/2012 | Hasegawa | H02M 3/155 323/284 |
| 2017/0244336 A1 * | 8/2017 | Kitamoto | H01M 8/04828 |
| 2019/0052171 A1 | 2/2019 | Kitamoto | |
| 2021/0184236 A1 * | 6/2021 | Park | B60L 58/40 |

FOREIGN PATENT DOCUMENTS

| JP | 2008098134 A | 4/2008 |
| JP | 2013145692 A | 7/2013 |
| JP | 2014232681 A | 12/2014 |
| JP | 2014235781 A | 12/2014 |

* cited by examiner

*Primary Examiner* — Raymond Alejandro
(74) *Attorney, Agent, or Firm* — Dickinson Wright, PLLC

(57) ABSTRACT

To provide a fuel cell system configured to appropriately measure the AC impedance of a fuel cell. A fuel cell system wherein the controller controls ON and OFF of the switches of n phases; wherein the controller operates the switches of the n phases at different phases, and the controller operates the switches of the n phases at the same duty ratio; wherein the controller operates the switches of the n phases at different duty ratios, when the controller determines that a specific condition is met; and wherein the controller measures the AC impedance of the fuel cell from the current waveform and voltage waveform of the fuel cell.

7 Claims, 9 Drawing Sheets

Enlarged in FIG. 11

Enlarged in FIG. 13

FUEL CELL SYSTEM

TECHNICAL FIELD

The disclosure relates to a fuel cell system.

BACKGROUND

Various studies have been made on the converter provided in a system installed and used in a vehicle such as a fuel cell electric vehicle (FCEV). In a DC/DC converter used in various electronic devices and the like, a circuit composed of a reactor, a switch, a diode, a capacitor and so on, is used often. By ON/OFF signals of the switch, the DC/DC converter controls the increasing and decreasing of current flowing through the reactor.

For example, Patent Literature 1 discloses a fuel cell system in which the AC impedance of a fuel cell stack can be measured precisely.

Patent Literature 2 discloses a fuel cell system mounted in a vehicle, which is capable of highly accurately measuring the impedance of a fuel cell without being influenced by load fluctuation of auxiliary equipment.

Patent Literature 3 discloses an impedance measuring method for calculating a highly accurate impedance in a short time by simple device and configuration.

Patent Literature 4 discloses a fuel cell system in which an AC voltage for measuring the impedance of a fuel cell is accurately applied to the fuel cell, by using a bidirectional step up/down converter provided with a dead time.
Patent Literature 1: Japanese Patent Application Laid-Open (JP-A) No. 2008-098134
Patent Literature 2: JP-A No. 2014-232681
Patent Literature 3: JP-A No. 2013-145692
Patent Literature 4: JP-A No. 2014-235781

The AC impedance of a fuel cell is used as an indicator for optimal control of the operating state of the fuel cell. A converter controls the step-up and step-down of the output voltage of the fuel cell, by switching the output voltage using a switching element (switch). It is known that in the converter, there is a response performance decrease region corresponding to a change in duty ratio. When the AC impedance of the fuel cell is measured in the response performance decrease region, the accuracy of superimposing high frequency signals from the converter to the fuel cell decreases. Accordingly, there is a problem in that the accuracy of the AC impedance measurement remarkably decreases.

A possible choice aimed at achieving a small-sized converter is to introduce a magnetically coupled converter including a magnetically coupled reactor in which several coils are magnetically coupled on the same core. In the magnetically coupled converter, to relax the magnetic saturation of the core of the reactor and reduce output current ripple, it is general to alternately switch the magnetically coupled coils so that the same duty ratios are the same the phase differences are equally spaced. When the power output from the fuel cell is low, the magnetically coupled reactor is operated in a discontinuous mode including the period of time in which the currents flowing through the coils are zero.

The existence of a "dead zone" was newly found. In the dead zone, during the operation of the reactor in the discontinuous mode in which current interruption occurs, the switches are put into a pseud switch-on state by a negative current that is passed from other coils by mutual inductance, which is a phenomenon specific to magnetically coupled reactors, and the switches cannot be smoothly switched from ON to OFF; moreover, the output current value of the fuel cell cannot be changed even when the duty ratios are changed. In the dead zone, even if an AC signal for AC impedance measurement is tried to be applied by changing the duty ratio, as described above, since the output current value of the fuel cell is nearly unchanged, the AC impedance of the fuel cell cannot be appropriately measured. This corresponds to the response performance decrease region of Patent Literature 1, and since the period of time in which the AC impedance is not measured or in which the AC impedance cannot be measured occurs frequently, there is a possibility that the fuel cell operating state cannot be optimally controlled.

SUMMARY

The disclosed embodiments were achieved in light of the above circumstances. An object of the disclosed embodiments is to provide a fuel cell system configured to appropriately measure the AC impedance of a fuel cell.

In a first embodiment, there is provided a fuel cell system, wherein the fuel cell system comprises a fuel cell and a converter for carrying out at least one selected from the group consisting of step-up and step-down of output voltage of the fuel cell;
  wherein the converter comprises:
    a reactor comprising coils of n phases (n is an integer of 2 or more), which are magnetically coupled to each other,
    switches of the n phases, which are connected to the coils, and
    a controller;
  wherein the controller controls ON and OFF of the switches of the n phases;
  wherein the controller monitors current values of the coils;
  wherein the controller measures an AC impedance of the fuel cell from a current waveform of and a voltage waveform of the fuel cell;
  wherein the controller operates the switches of the n phases at different phases, and the controller operates the switches of the n phases at a same duty ratio;
  wherein the controller operates the switches of the n phases at different duty ratios, when the controller determines that the following condition 1 is met:
    Condition 1: an operating condition in which, when the switches of the n phases are operated at different phases, and when currents flowing through the coils are in a discontinuous mode and a current value flowing through the coil of one of the n phases is kept at zero, the switch connected to the coil of at least one of the remaining phases is switched from ON to OFF.

The controller may operate the switches of the n phases at a phase difference of $(360/n)°$.

The controller may set an offset current value y, which is added to or subtracted from each of command current values of the magnetically coupled coils of the n phases, to 25% to 75% of a dead zone current interval so that target current values of the magnetically coupled coils of the n phases are different from each other, and the controller may unequally distribute the target current values so that the target current values of the coils, which are obtained by adding or subtracting the offset current value y to or from the command current values, are different from each other, and the controller may operate the switches at different duty ratios.

The controller may preliminarily store a current distribution difference map derived from a relationship between inlet voltage of the converter, outlet voltage of the converter, and current values flowing through the coils of the reactor, and based on the current distribution difference map, the controller may unequally distribute the target current values so that the target current values of the coils are different from each other, and the controller may operate the switches at different duty ratios.

The controller may preliminarily store an operating condition of the converter, which corresponds to the condition 1, as a data group, and by comparing a latest operating condition of the converter with the data group, the controller may determine whether or not the condition 1 is met.

When n is 2 (n=2) and the switches of the two magnetically coupled phases are operated at a phase difference of 180°, the controller may determine that the condition 1 is met when the currents flowing through the coils are in the discontinuous mode and the duty ratios of the switches of the two phases are less than 50% (D<0.5) and satisfy any one of the following formulae (A) and (B):

$$D < \{(1/2)(L-M)(V_H - V_L)\}/(LV_L + MV_L - MV_H) \quad \text{Formula (A)}$$

$$D < (1/2)\{1 - (V_L/V_H)\} \quad \text{Formula (B)}$$

where L is self-inductance of the reactor; M is mutual inductance of the reactor; $V_H$ is the outlet voltage of the converter; $V_L$ is the inlet voltage of the converter; and D is the duty ratio (-).

The controller may confirm whether or not there is a request for AC impedance measurement of the fuel cell; when the controller confirms that there is a request for AC impedance measurement of the fuel cell, the controller may determine whether or not the condition 1 is met; and when the controller determines that the condition 1 is met, the controller may operate the switches of the n phases at different duty ratios and may measure the AC impedance of the fuel cell.

By the fuel cell system of the disclosed embodiments, the AC impedance of the fuel cell can be appropriately measured.

BRIEF DESCRIPTION OF THE DRAWINGS

In the accompanying drawings.

DETAILED DESCRIPTION

The fuel cell system of the disclosed embodiments is a fuel cell system,
wherein the fuel cell system comprises a fuel cell and a converter for carrying out at least one selected from the group consisting of step-up and step-down of output voltage of the fuel cell;
wherein the converter comprises:
a reactor comprising coils of n phases (n is an integer of 2 or more), which are magnetically coupled to each other,
switches of the n phases, which are connected to the coils, and
a controller;
wherein the controller controls ON and OFF of the switches of the n phases;
wherein the controller monitors current values of the coils;
wherein the controller measures an AC impedance of the fuel cell from a current waveform of and a voltage waveform of the fuel cell;
wherein the controller operates the switches of the n phases at different phases, and the controller operates the switches of the n phases at a same duty ratio;
wherein the controller operates the switches of the n phases at different duty ratios, when the controller determines that the following condition 1 is met:
Condition 1: an operating condition in which, when the switches of the n phases are operated at different phases, and when currents flowing through the coils are in a discontinuous mode and a current value flowing through the coil of one of the n phases is kept at zero, the switch connected to the coil of at least one of the remaining phases is switched from ON to OFF.

In a magnetically coupled converter, the dead zone may occur, in which the output current value of the fuel cell is not changed even when the duty ratios of the switches are changed. In this case, the AC impedance of the fuel cell cannot be appropriately measured. In the disclosed embodiments, the occurrence frequency of the dead zone, which is a phenomenon specific to a magnetically coupled reactor, is controlled to be minimized, and then the AC impedance of the fuel cell is measured. An example of the control is as follows: in the condition in which the dead zone occurs, the average current values flowing through the magnetically coupled coils of the phases are made different from each other, thereby avoiding the dead zone and appropriately carrying out the AC impedance measurement of the fuel cell. By making the current values flowing through the magnetically coupled coils of the phases different from each other, at least one of the phases falls outside the dead zone range. Accordingly, the phase outside the dead zone can change the current. As a result, the AC impedance of the fuel cell can be appropriately measured, and the fuel cell operating state can be optimally controlled.

Figure 1:
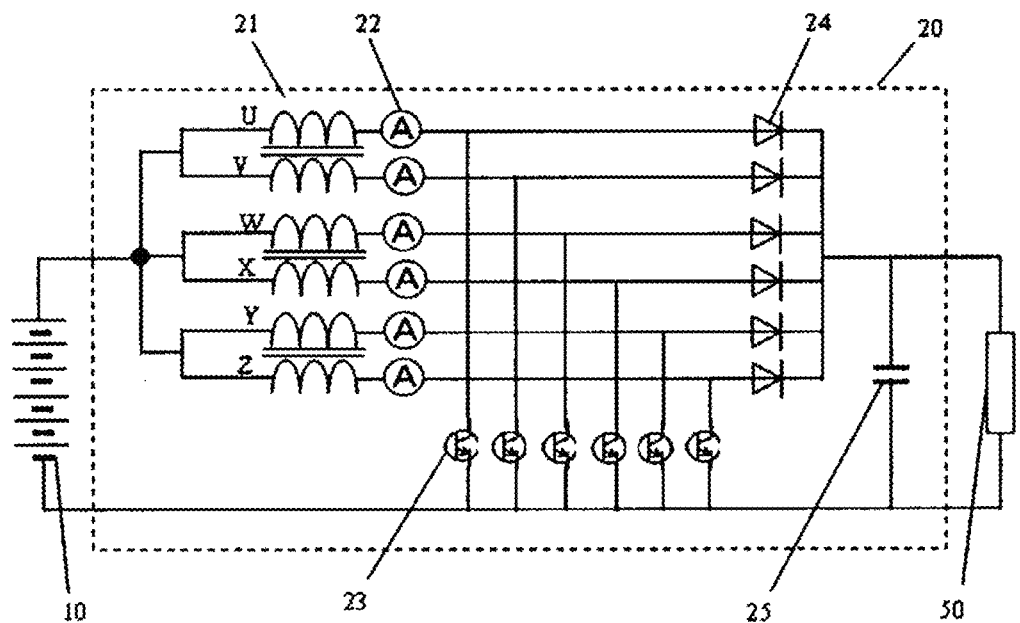
FIG. 1 is a diagram showing an example of the configuration of the circuit of a fuel cell system including a step-up converter and peripheral devices.

FIG. 1 is a diagram showing an example of the configuration of the circuit of a fuel cell system including a step-up converter and peripheral devices.

The fuel cell system shown in FIG. 1 is installed in a vehicle, for example. As an external load 50, a vehicle drive motor is connected through an inverter. The fuel cell system may include a battery (not shown) in parallel with a fuel cell 10 and a step-up converter 20. The output power of the fuel cell 10 is stepped up by the step-up converter 20, converted from DC to AC by the inverter, and then supplied to the motor.

The step-up converter 20 includes the step-up circuits of 6 phases, which are connected in parallel with each other. FIG. 1 shows a configuration including the step-up circuits of 6 phases. However, the number of the phases is not particularly limited.

Each of the step-up circuits includes a reactor 21, a current sensor 22, a switch 23, a diode 24, and a capacitor 25. Each step-up circuit may include an input voltage sensor and an output voltage sensor. Of the step-up circuits of the 6 phases, every two phases can be magnetically coupled to each other by sharing the core of one reactor 21. In each step-up circuit, by turning the switch 23 ON, the current flowing through the reactor 21 increases. By turning the switch 23 OFF, the current flowing through the reactor 21 decreases. When the current reaches zero, the current is kept at zero. The current sensor 22 acquires the current value flowing through the reactor 21.

A controller (not shown) controls ON and OFF of the switch 23, thereby controlling the step-up ratio at the converter 20 and the output current value from the fuel cell 10.

The output power of the fuel cell 10 largely changes depending on requests from the vehicle (such as speed, acceleration rate, load capacity and road gradient). As a result, the output current largely changes. When the output current of the fuel cell 10 is large, if the current is passed to one step-up circuit, heat generation increases to reduce the power conversion efficiency of the step-up converter 20. Even when a small current is passed through a step-up circuit resistant to a large current, an increase in energy loss occurs to reduce the power conversion efficiency of the step-up converter 20. Accordingly, the step-up converter 20 includes the step-up circuits of several phases (6 phases in FIG. 1) and depending on the output current value of the fuel cell 10, the step-up converter 20 switches the number of the operated phases. For example, when the output current value of the fuel cell 10 is from 0 A to 150 A, two phases are operated. When the output current value of the fuel cell 10 is from 150 A to 300 A, 4 phases are operated. When the output current value of the fuel cell 10 is from 300 A to 600 A, 6 phases are operated. The efficiency of the step-up circuits varies depending on the flowing current, and by changing the number of the operated phases, the step-up circuits can be operated at optimal efficiency in each current range.

The fuel cell system includes the fuel cell and the converter.

The fuel cell may be a single unit fuel cell, or it may be a fuel cell stack composed of stacked unit fuel cells.

The converter carries out at least one of step-up and step-down of the output voltage of the fuel cell. The converter may be a step-up converter, a step-down converter, or a step-up/step-down converter.

The converter may be a DC/DC converter.

The converter comprises the reactor comprising the coils of the n phases (n is an integer of 2 or more), which are magnetically coupled to each other, the switches of the n phases, which are connected to the coils, and the controller. The converter may further include a diode, a current sensor, a voltage sensor, a photocoupler, a capacitor and so on.

The reactor includes the coils and the core.

The coils of the n phases (n is an integer of 2 or more) may be wound around the core. As described above, "n" may be 2 or more, and the upper limit is not particularly limited. The upper limit may be 10 or less, 5 or less, 4 or less, or 3 or less.

The core and coils of the reactor may be employed from cores and coils used in conventionally-known converters.

In the disclosed embodiments, a reactor including a core and one independent coil wound around the core, is referred to as a non-magnetically coupled reactor; a converter including the non-magnetically coupled reactor is referred to as a non-magnetically coupled converter; a reactor including a core and two or more independent coils wound around the core, is referred to as a magnetically coupled reactor; and a converter including the magnetically coupled reactor is referred to as a magnetically coupled converter.

In the disclosed embodiments, the independent coil means a coil including one or more windings and two terminals.

The switch (switching element) is composed of a transistor and a protection diode. The transistor may be an npn-type transistor such as an insulated gate bipolar transistor (IGBT) and a metal oxide semiconductor field effect transistor (MOS FET).

The diode may be employed from diodes used in conventionally-known converters.

The current sensor is not particularly limited, as long as it can acquire the current values flowing through the coils of the reactor (hereinafter, it may be referred to as "reactor current"). As the current sensor, a conventionally-known current meter or the like may be used. In the disclosed embodiments, the average reactor current means the average current flowing through the coil in the switching period of the duty ratio control.

The voltage sensor is not particularly limited, as long as it can acquire the input voltage which is output from the fuel cell and input into the converter. As the voltage sensor, for example, a conventionally-known voltmeter may be used.

The controller may be an electronic control unit (ECU) or the like. The ECU includes a central processing unit (CPU), a memory, and an input/output buffer.

By a signal from the current sensor, the controller detects the current values flowing through the coils of the n phases of the reactor, and the controller monitors the current values of the coils.

The controller controls ON and OFF of the switches of the n phases. The controller may operate the switches of the magnetically coupled n phases at a certain frequency.

By periodically switching an ON command and an OFF command to the switches, the controller may carry out ON-OFF control of the switches and may control the duty ratios of the switches of the n phases. The output current value from the fuel cell may be controlled thereby.

The step-up converter is stepped up by repeating the switching operation for storing and releasing electrical energy in and from the reactor. The duty ratio defines the ratio of an energy storing period to the switching period of the step-up operation. In the energy storing period, the switching element is opened to store electrical energy in the reactor. The duty ratio D is represented by the following formula:

$$D(-)=T_{ON}/T$$

where T is the switching period of the step-up operation in the step-up converter; $T_{ON}$ is the period of time in which the switching element is turned ON; and $T_{OFF}$ is the period of time in which the switching element is turned OFF.

For the sake of simplicity, the duty ratio may be expressed in %. In this case, the duty ratio D is represented by the following formula:

$$D(\%)=T_{ON}/T\times100.$$

In the disclosed embodiments, the switching period means the period of time between when the switches switch from OFF to ON and when the switches switch from OFF to ON again.

The controller may operate the switches of the n phases at a phase difference of $(360/n)°$.

When the switches are the switches of two phases and when the two switches are operated at different phases, the two switches may be operated at a phase difference of from 30° to 180°, or they may be operated at a phase difference of 180° (that is, at the opposite phase) from the viewpoint of increasing the power conversion efficiency. When the switches are operated at the opposite phase, a phase error may be caused in a range of form −5° to +5°.

The controller operates the switches of the n phases at different phases, and the controller operates the switches of the n phases at the same duty ratio.

The controller operates the switches of the n phases at different duty ratios, when the controller determines that the following condition 1 is met. That is, the average current values flowing through the coils of the n phases are made different from each other.

Condition 1: the operating condition in which, when the switches of the n phases are operated at different phases, and when currents flowing through the coils are in the discontinuous mode and a current value flowing through the coil of one of the n phases is kept at zero, the switch connected to the coil of at least one of the remaining phases is switched from ON to OFF.

In the case of a three or more phase magnetically coupled reactor, the operating condition in which the current value flowing through the coil of one of the n phases is kept at zero and the switch(es) connected to the coil(s) of the remaining phase(s) is switched from ON to OFF, may be an operating condition in which the switch of at least one of the remaining phase(s) is switched from ON to OFF.

When the switches of the n magnetically coupled phases are operated at a phase difference of $(360°/n)$, the condition 1 may be the discontinuous mode and the time when the duty ratios are less than $(100-100/n)$ %.

The controller may preliminarily store the operating condition of the converter, which corresponds to the condition 1, as a data group, and by comparing the latest operating condition of the converter with the data group, the controller may determine whether or not the condition 1 is met. Accordingly, it is possible to avoid entering the dead zone, and the accuracy of the AC impedance measurement of the fuel cell increases.

[Description of the Dead Zone]

The dead zone means a region where the average current values flowing through the coils of the reactor are nearly unchanged when the PWM duty ratio of the converter is increased or decreased. In the case of a two-phase magnetically coupled unidirectional step-up (step-down) circuit, due to the negative current generated by the mutual inductance of magnetic coupling, the dead zone appears in a part of the discontinuous mode region where the duty ratios are 50% or less.

Figure 2:
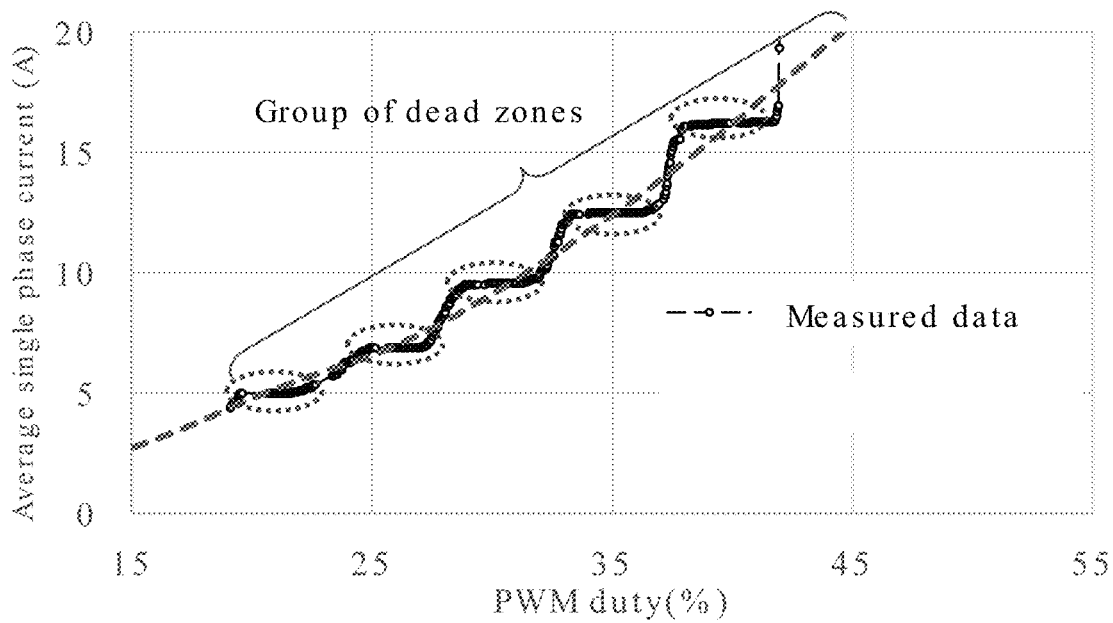
FIG. 2 is a graph of a change in the average current value flowing through each of the coils of the reactor (the average single phase current value) when the magnetically coupled coils of two phases are operated at an input voltage (Vfc) of 200 V, an output voltage (Vh) of 350 V and a constant step-up ratio, and the duty ratio is gradually increased.

FIG. 2 is a graph of a change in the average current value flowing through each of the coils of the reactor (the average single phase current value) when the magnetically coupled coils of two phases are operated at an input voltage (Vfc) of 200 V, an output voltage (Vh) of 350 V and a constant step-up ratio, and the duty ratio is gradually increased. In FIG. 2, the self-inductance of the coils is 96.4 µH; the mutual inductance of the coils was 62.7 µH; and the operation frequency of the switches is 20 kHz.

According to the equation for calculating the average current values flowing through the coils of the reactor, which will be described later, as indicated by a dashed line shown in FIG. 2, the average current values flowing through the coils of the reactor are supposed to monotonically increase as the duty ratio increases. In fact, as indicated by a solid line, the average current values flowing through the coils increase in a stepwise manner, and in the areas surrounded by dotted lines, there is the dead zone in which the average current values flowing through the coils of the reactor do not change even when the duty ratios are increased. When the average current values flowing through the coils of the reactor are present in the dead zone, even when the duty ratios are changed, the average current values flowing through the coils of the reactor, that is, the output current value of the fuel cell do not change, and the AC impedance of the fuel cell cannot be appropriately measured.

Figure 3:
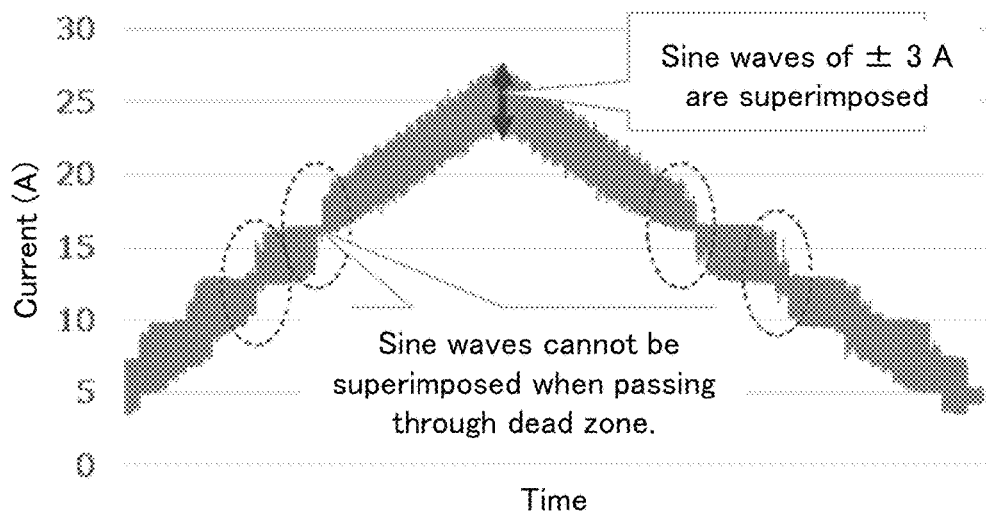
FIG. 3 is a graph of current waveforms when the magnetically coupled coils of two phases are operated, when a 270 Hz sine wave with an amplitude of ±3 A is superimposed on each of the phases, and when DC load current is swept in a range of from 5 A to 25 A.

FIG. 3 is a graph of current waveforms when the magnetically coupled coils of two phases are operated, when a 270 Hz sine wave with an amplitude of ±3 A is superimposed on each of the phases, and when DC load current is swept in a range of from 5 A to 25 A. In FIG. 3, as with FIG. 2, the step-up ratio is kept constant at an input voltage (Vfc) of 200 V and an output voltage (Vh) of 350 V; the self-inductance of the coils is 96.4 µH; the mutual inductance of the coils is 62.7 µH; and the operation frequency of the switches is 20 kHz. In the case of FIG. 3, since the relationship between the duty ratios and the average current values flowing through the coils of the reactor is thought to follow the dashed line shown in FIG. 2, the duty ratios are increased or decreased along the dashed line. However, as described above, the current values actually change in a stepwise manner, like the solid line shown in FIG. 2.

Accordingly, the currents do not change even when the duty ratios are increased or decreased in the dead zones surrounded by the dotted lines in FIG. 2. As indicated by the dotted lines in FIG. 3, there are regions where a sine wave cannot be superimposed on the currents, and the AC impedance of the fuel cell cannot be measured in the regions. If a rapid change in DC load occurs in the specified regions surrounded by the dotted lines in FIG. 3, there is a possibility that the output response of the fuel cell is delayed, and a load applied to the battery and so on is increased.

In consideration of FIG. 3, when the duty ratios of the switches of the n phases are increased or decreased so that the amplitudes of the current values of the coils become normal amplitudes, and when the thus-measured amplitudes of the current values of the coils are smaller than an expected value, the controller may determine that the condition 1 is met. When the amplitudes of the current values of the coils are smaller than the expected value, the controller may determine that it corresponds to the state of not superimposing a sine wave and the measured current values of the coils have entered the dead zone.

Figure 4:
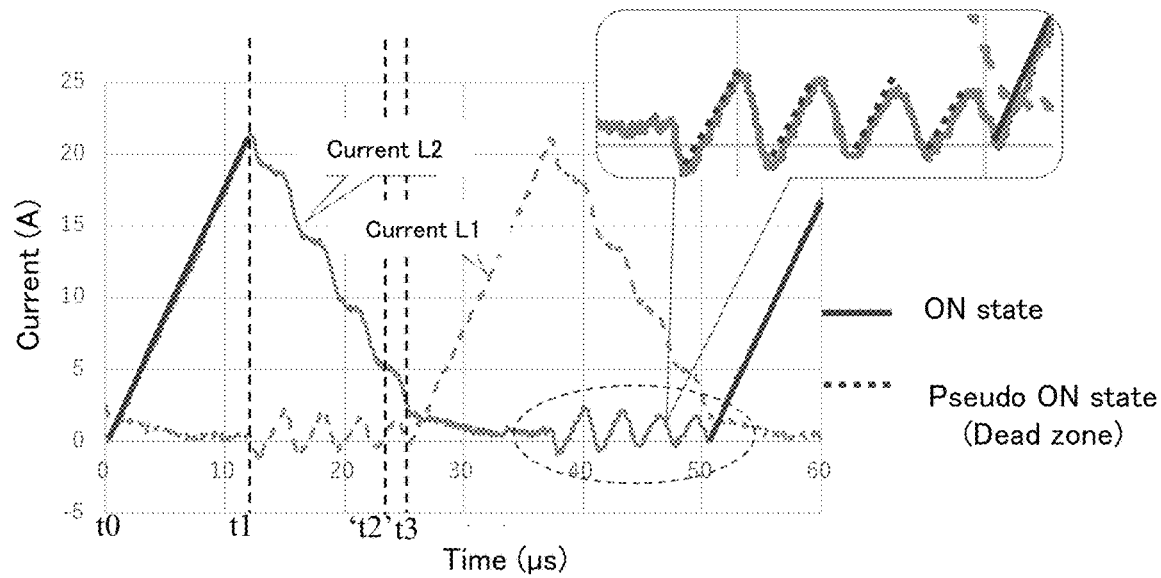
FIG. 4 is a graph showing the current waveforms of the magnetically coupled coils of two phases in a region where a dead zone occurs.

FIG. 4 is a graph showing the current waveforms of the magnetically coupled coils of two phases in the region where the dead zone occurs. In FIG. 4, L1 is the current of phase U, and L2 is the current of phase V.

During the period of time from t0 to t1, the switch of the phase V is ON, and the current L2 gradually increases. On the other hand, the switch of the phase U is OFF, and the current L1 is kept at 0. Since the switch of the phase V is switched from ON to OFF at the time t1, the current L2 of the phase V starts to decrease. At this time, the switch of the phase U is kept OFF; however, after the time t1, the L1 current flowing through the phase U by the interaction of phase V alternately decreases and increases.

Even if the switch of the phase U is turned ON when, like the time t2, the current L1 of the phase U is increasing, the switch ON signal is not recognized since the current has already increased. Then, the switch ON signal of the phase U is first recognized at the timing when, like the time t3, the current L1 of the phase U decreases. Then, the current L1 increases until the switch of the phase U is turned OFF. Since the timing when the switch ON signal is not recognized and the timing when the switch ON signal is recognized appear alternately, as shown in FIG. 2, the dead zone appears repeatedly.

As described above, if the switch of one of the magnetically coupled phases is switched from ON to OFF when the current value of the other phase is 0, there is an increase and decrease in the current flowing through the coil of the other phase. As a result, the dead zone appears.

Accordingly, it can be said that the dead zone appears in the following operating condition: as described in the condition 1, when the switches of the n phases are operated at different phases, when the currents flowing through the coils are in the discontinuous mode and the current value of the coil of one of the magnetically coupled phases is kept at 0, and when the switch of the other phase is switched from ON to OFF, the dead zone appears.

When two phases are magnetically coupled, the two phases may be operated at a phase difference of 180°. In this case, as long as the currents flowing through the coils are in the discontinuous mode and the duty ratios are less than 50%, the dead zone appears in the following operating condition: when the average current value of the coil of one of the magnetically coupled phases is kept at 0 and when the switch of the other phase is switched from ON to OFF, the dead zone appears.

Figure 5:
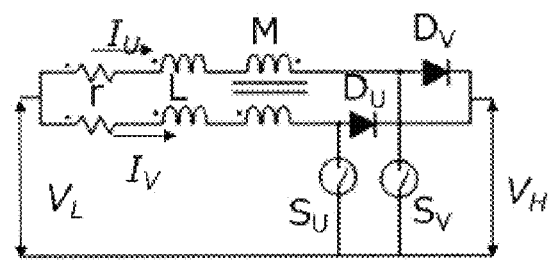
FIG. 5 is a diagram showing an example of a two-phase (phase U and phase V) magnetically coupled step-up circuit.

FIG. 5 is a diagram showing an example of a two-phase (phase U and phase V) magnetically coupled step-up circuit. In FIG. 5, $V_L$ is the input voltage (the voltage before step-up); $I_U$ is the current of the phase U; $I_V$ is the current of the phase V; $V_H$ is the output voltage (the voltage after step-up): D is the diode: S is the switch; M is the mutual inductance; L is the self-inductance; and r is internal resistance.

The following equation (1) is the equation of the state of the vector of the current I. By solving the equation, the current curve indicated by the dashed line shown in FIG. 2 is obtained. The vector of the voltage V of the equation (1) is expressed as shown in Table 1. Table 1 shows the vector of the voltage V of the equation (1) and the dead zone occurrence condition (areas marked with diagonal lines).

Due to the negative current generated by the mutual inductance (expressed by "M" in FIG. 5 and the equation (1)) of magnetic coupling, in the two-phase magnetically coupled unidirectional step-up (step-down) circuit, as indicated by the areas marked with the diagonal lines shown in Table 1, the dead zone appears in a part of the discontinuous mode region where the switches of both of the phases are in the OFF state, that is, the switches are operated at a phase difference of 180° and the duty ratios are less than 50%. The mechanism for the occurrence of the dead zone can be obtained by solving the equation (1) along the timeline in the condition shown in Table 1. More specifically, when the switches of both of the phases are in the OFF state and when the current flowing through one of the coils is 0 A and the current flowing through the other coil is positive, electromotive voltage is generated by mutual inductance in the 0 A-side coil, thereby generating a negative current. Then, as the negative current increases, the electromotive force of the coil is lost, and the negative current decreases. However, during the period of time taken to return the current flowing through the 0 A-side coil to 0 A, like the areas marked with the diagonal lines in Table 1, the switches are in the pseudo ON state. Accordingly, even when the negative current-side switch is ON or OFF, no influence can be made on the current wavelength, and the dead zone occurs.

For example, in the case of a three-phase (U, V and W) magnetically coupled step-up circuit, the dead zone occurs in the following condition: the dead zone occurs when the switches of all of the three phases are OFF and when $I_U > 0$, $I_V \leq 0$ and $I_W \leq 0$, or the dead zone occurs when the switches of all of the three phases are OFF and when $I_U > 0$, $I_V > 0$ and $I_W \leq 0$.

In addition to the step-up circuit, the step-down circuit and the step-up/step-down circuit have the current control dead zone problem, and the occurrence of the dead zone can be avoided or suppressed by operating the switches at the same phase when the dead zone occurs. It is thought that there is no dead zone in a two-way circuit which does not have a discontinuous mode.

$$\vec{I} = \frac{1}{(L^2 - M^2)} \begin{pmatrix} L & M \\ M & L \end{pmatrix} (\vec{V} - r\vec{I}) \qquad (1)$$

TABLE 1

| V vector | Phase U ON | Phase U OFF $I_U > 0$ | Phase U OFF $I_U \leq 0$ |
|---|---|---|---|
| Phase V ON | $\vec{V} \equiv \begin{pmatrix} V_L \\ V_L \end{pmatrix}$ | | $\vec{V} \equiv \begin{pmatrix} V_L - V_H \\ V_L \end{pmatrix}$ |

TABLE 1-continued

| V vector | Phase U ON | Phase U OFF $I_U > 0$ | Phase U OFF $I_U \leq 0$ |
|---|---|---|---|
| Phase V OFF $I_U > 0$ | $\vec{V} \equiv \begin{pmatrix} V_L \\ V_L - V_H \end{pmatrix}$ | $\vec{V} \equiv \begin{pmatrix} V_L - V_H \\ V_L - V_H \end{pmatrix}$ | |
| Phase V OFF $I_V \leq 0$ | | | $\vec{V} \equiv \begin{pmatrix} V_L \\ V_L \end{pmatrix}$ |

[Description of Continuous Mode and Discontinuous Mode]

Figure 6:
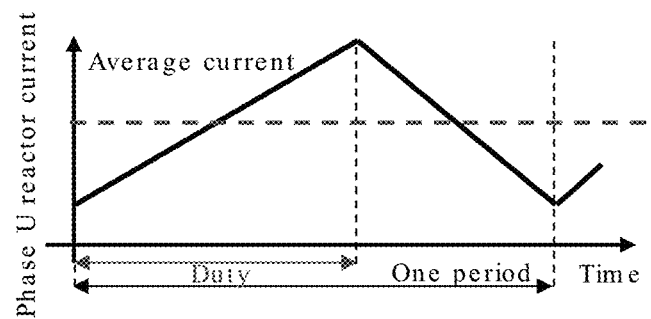
FIG. 6 is a graph of an example of a current waveform when a current flowing through the coil of the reactor of phase U of a step-up converter, is in a continuous mode.

FIG. 6 is a graph of an example of a current waveform when a current flowing through the coil of the reactor of phase U of a step-up converter, is in a continuous mode.

Figure 7:
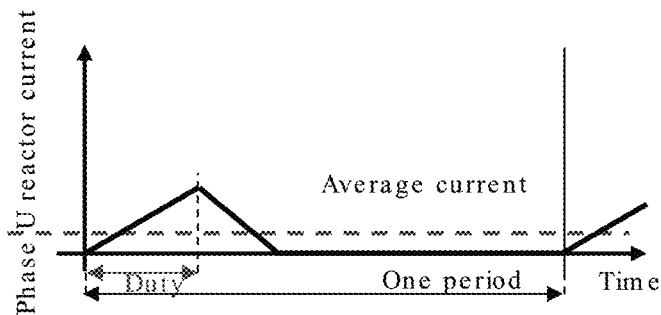
FIG. 7 is a graph of an example of a current waveform when a current flowing through the coil of the reactor of phase U of a step-up converter, is in a discontinuous mode.

FIG. 7 is a graph of an example of a current waveform when a current flowing through the coil of the reactor of phase U of a step-up converter, is in a discontinuous mode.

As shown in FIG. 6, along with switching operation, the current flowing through the coil of the reactor of the phase U of the step-up converter (i.e., the reactor current) become a triangle wave, and the median value of the triangle wave is the average reactor current (hereinafter, it will be referred to as "average current"). When the average current is decreased by decreasing the duty ratio, the lowest point of the triangle wave reaches 0 A. When the average current is further decreased, since the step-up converter is a one-way circuit, as shown in FIG. 7, the period of time in which the reactor current is zero, starts to occur. As just described, the operation including the period of time in which the current flowing through the coil of the reactor reaches zero during the switching period of the control of the duty ratio of the converter, is referred to as the discontinuous mode, and the operation not including the period of time in which the current flowing through the coil of the reactor reaches zero during the switching period of the control of the duty ratio, is referred to as the continuous mode.

<Pattern A>

In the case of the two-phase magnetically coupled reactor, at the time of operating the magnetically coupled coils of the two phases when entering or coming close to the dead zone occurrence region corresponding to the condition 1 during the operation of the fuel cell system, the two phases are controlled based on unequal command current values to prevent the two phases from entering the dead zone shown in FIG. 2 at the same time. Accordingly, at least one phase can pass through the dead zone; the controller is kept in a fit state to control the current flowing through one of the coils; and a sine wave can be superimposed on the currents flowing through the coils of the two phases.

In the case of the two-phase magnetically coupled reactor, the dead zone occurrence region corresponding to the condition 1 may be the time when the currents flowing through the coils are in the discontinuous mode, and the duty ratio is less than 50%. Accordingly, for example, at the timing when the output requested to the fuel cell is decreased and when the currents flowing through the coils are in the discontinuous mode and the duty ratios are decreased from 50% or more to less than 50%, the operating condition may move from the state in which the average current values flowing through the electrically connected coils of the two phases are the same (the target current values are the same) to the state in which the average current values flowing through the electrically connected coils of the two phases are different (the target current values are different).

Figure 8:
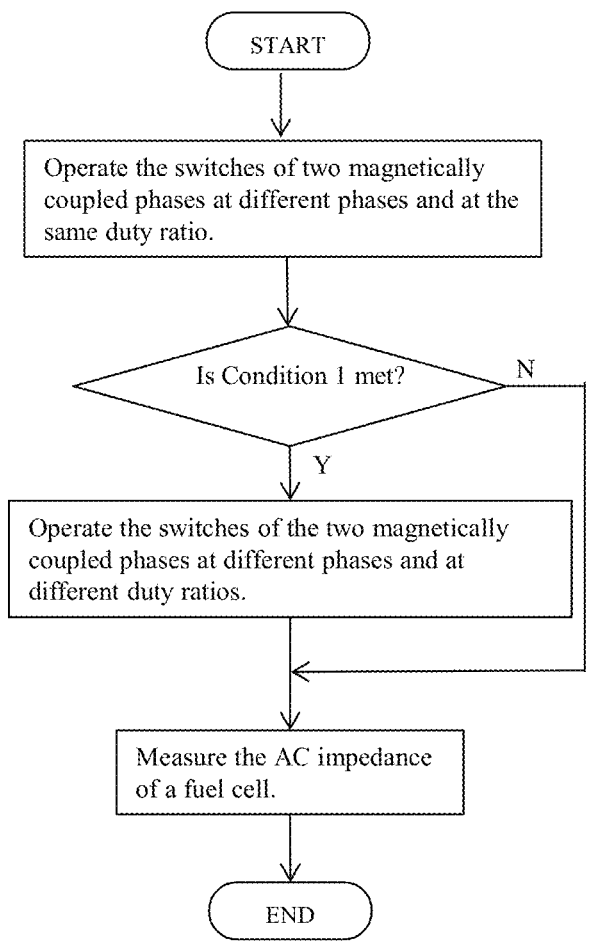
FIG. 8 is a flowchart of an example of control when AC impedance measurement of a fuel cell is carried out in a fuel cell system including a converter that includes a two-phase magnetically coupled reactor.

FIG. 8 is a flowchart of an example of control when AC impedance measurement of a fuel cell is carried out in a fuel cell system including a converter that includes a two-phase magnetically coupled reactor.

FIG. 8 shows an example of the above-described pattern A. The controller generally operates the switches of the two phases at different phases and at the same duty ratio. Then, the controller determines whether or not the condition 1 is met. When the condition 1 is met, the controller changes the operation of the switches of the two phases from the operation of the switches at different phases and at the same duty ratio to the operation of the switches at different phases and at different duty ratios, and then AC impedance measurement of the fuel cell is carried out. On the other hand, when the condition 1 is not met, the controller operates the switches of the two phases at different phases and the same duty ratio, and then AC impedance measurement of the fuel cell is carried out.

The controller may set the offset current value y, which is added to or subtracted from each of the command current values of the magnetically coupled coils of the n phases, to 25% to 75% of the dead zone current interval so that the target current values of the magnetically coupled coils of the n phases are different from each other.

The controller may unequally distribute the target current values so that the target current values of the coils, which are obtained by adding or subtracting the offset current value y to or from the command current values, are different from each other, and the controller may operate the switches at different duty ratios.

The controller may preliminarily store a current distribution difference map derived from the relationship between the inlet voltage of the converter, the outlet voltage of the converter, and the current values flowing through the coils of the reactor, and based on the current distribution difference map, the controller may unequally distribute the target current values so that the target current values of the coils are different from each other, and the controller may operate the switches at different duty ratios.

In the case of distributing the current of the fuel cell to the operated phases, when the total input current to the converter is I (A) and the number of the operated phases is n (n is 2, 4 or 6, for example), the command current value to the coil of each phase is expressed as follows: I/n (A).

Based on the command current values (I/n (A)) of the coils of the phases, the offset value of the two-phase (U and V) magnetically coupled reactor, that of the two-phase (W and X) magnetically coupled reactor, and that of the two-phase (Y and Z) magnetically coupled reactor, are set to the same offset value (y (A)).

In the two-phase (U and V) magnetically coupled reactor, an unequal current distribution may be made as follows. The offset value (y (A)) is added to the command current value (I/n (A)), and the resultant (I/n+y (A)) is passed to the phase U; moreover, the offset value (y (A)) is subtracted from the command current value (I/n (A)), and the resultant (I/n−y (A)) is passed to the phase V, thereby making an unequal current distribution to the phases U and V. Also in the two-phase (W and X) magnetically coupled reactor and the two-phase (Y and Z) magnetically coupled reactor, unequal current distribution may be carried out in the same manner as the two-phase (U and V) magnetically coupled reactor.

The offset value y may be from 1 to 3, for example.

When the two magnetically coupled coils of the phases are operated as shown in FIG. 2, the current interval at which the dead zone appears, is preliminarily acquired, and the value y may be selected so that the interval at which the dead zone does not coincide with 2y.

When the condition corresponding to the condition 1 (that is, the currents flowing through the coils are in the discontinuous mode, and the duty ratios are less than 50%) is not met, the average current values flowing through the magnetically coupled coils of the two phases may be set equal to each other. As a result, ripple current generated in the converter is decreased; heat generation is suppressed; and the efficiency of the converter is kept high.

<Pattern B>

In the above-describe pattern A, when entering the dead zone occurrence region corresponding to the condition 1, the operation of the switches are switched so that the average current values flowing through the magnetically coupled coils of the phases are different from each other. Also, the operation of the switches may be switched when the AC impedance of the fuel cell is acquired.

As described above, generally, the AC impedance is acquired at predetermined timings during the operation of the fuel cell system. By making the average current values flowing through the reactor of the magnetically coupled phases different from each other, as described above, the ripple current increases, and heat generation increases. Accordingly, during the normal operation, the average current values of the magnetically coupled coils of the phases may be the same.

By making the average current values different from each other only when acquiring the AC impedance, the ripple current generated in the converter is decreased; heat generation is suppressed; and the efficiency of the converter is kept high.

If the currents enter the dead zone region when trying to measure the AC impedance and the AC impedance cannot be measured, the AC impedance may be measured after the currents are offset. If, even though the currents are offset, the currents cannot leave the dead zone, the offset amount may be changed.

Figure 9:
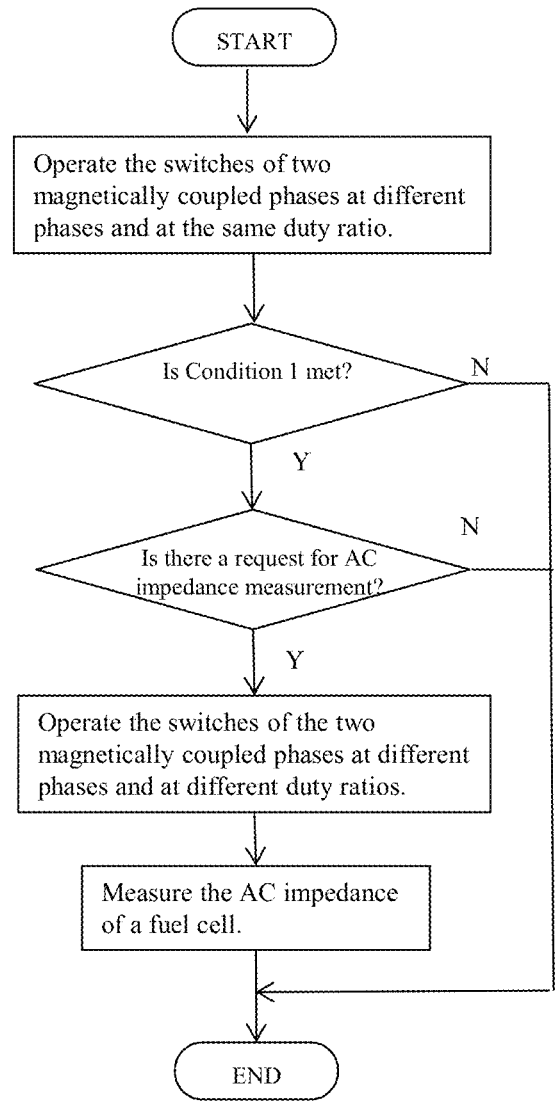
FIG. 9 is a flowchart of another example of control when AC impedance measurement of a fuel cell is carried out in a fuel cell system including a converter that includes a two-phase magnetically coupled reactor.

FIG. 9 is a flowchart of another example of control when AC impedance measurement of a fuel cell is carried out in a fuel cell system including a converter that includes a two-phase magnetically coupled reactor.

FIG. 9 shows an example of the pattern B. The controller operates the switches of the two phases at different phases and at the same duty ratio. Then, the controller determines whether or not the condition 1 is met. When the controller determines that the condition 1 is met, the controller determines whether or not there is a request for AC impedance measurement of the fuel cell. When the controller determines that there is a request for AC impedance measurement of the fuel cell, the controller changes the operation of the switches of the two phases from the operation of the switches at different phases and at the same duty ratio to the operation of the switches at different phases and at different duty ratios. Then, the controller measures the AC impedance of the fuel cell. On the other hand, when the controller determines that there is no request for AC impedance measurement of the fuel cell, the controller operates the switches of the two phases at different phases and at the same duty ratio.

Accordingly, only when the condition 1 is met and the AC impedance measurement of the fuel cell is carried out, the controller may operate the switches of the two phases at different duty ratios. In other cases, the controller may operate the switches of the two phases at the same duty ratio. The controller determines whether or not there is a request for AC impedance measurement of the fuel cell, and when it determines that there is a request for AC impedance measurement of the fuel cell, the controller may determine whether or not the condition 1 is met.

<Pattern C>

By frequently switching the state in which the average current values are different and the state in which the average current values the same, the control may be complicated. Accordingly, the average current values may be always different. Although the efficiency decreases, the complication of the control by the current switching is suppressed.

<Pattern D>

To uniformize the loads applied to the switches and reactors, the offset values (+y) and (−y) of the paired phases may be switched every time the ignition switch of a vehicle is turned ON (IG-ON) or at regular intervals.

Figure 10:
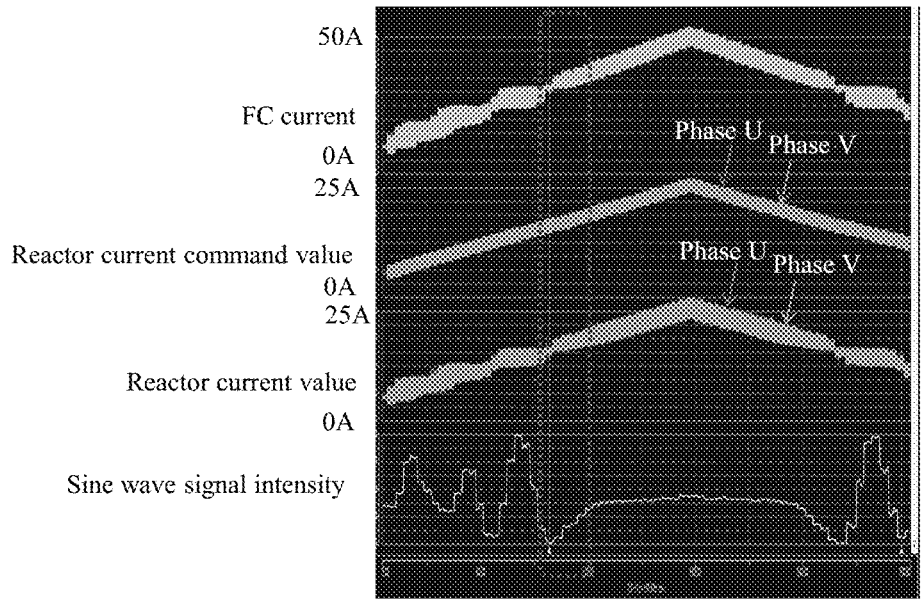
FIG. 10 shows current behavior when a target current value is equally distributed and passed so that the average current values flowing through the magnetically coupled coils of two phases are the same, and when the average current values are increased from 5 A to 25 A and then decreased.
Figure 11:
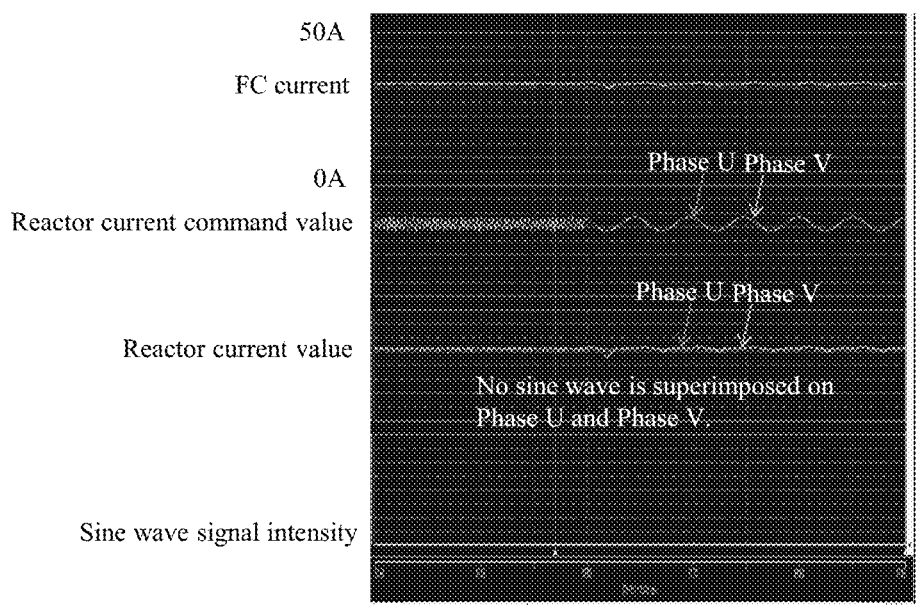
FIG. 11 is a partial enlarged view of FIG. 10.

FIG. 10 shows current behavior when a target current value is equally distributed and passed so that the average current values flowing through the magnetically coupled coils of two phases are the same, and when the average current values are increased from 5 A to 25 A and then decreased. FIG. 11 is a partial enlarged view of FIG. 10.

Figure 12:
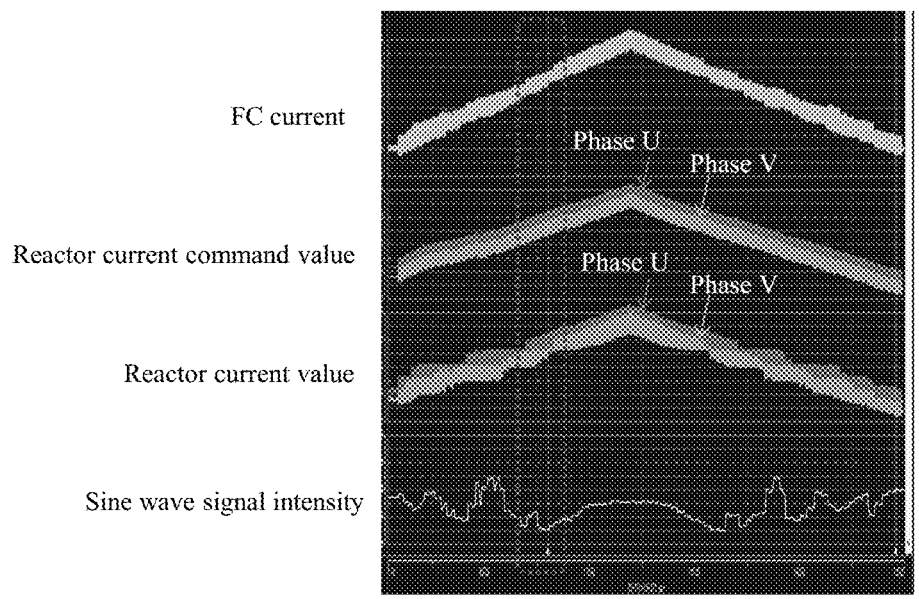
FIG. 12 shows current behavior when currents are offset by 2 A and a target current value is unequally distributed and passed so that the average current values flowing through the magnetically coupled coils of two phases are different, and when the average current values are increased from 5 A to 25 A and then decreased.
Figure 13:
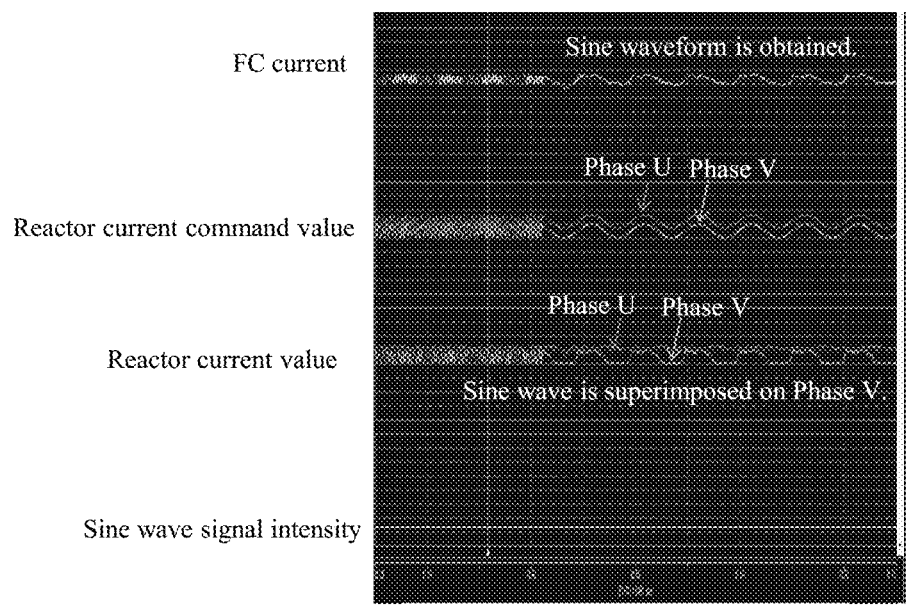
FIG. 13 is a partial enlarged view of FIG. 12.

FIG. 12 shows current behavior when currents are offset by 2 A and a target current value is unequally distributed and passed so that the average current values flowing through the magnetically coupled coils of two phases are different, and when the average current values are increased from 5 A to 25 A and then decreased. FIG. 13 is a partial enlarged view of FIG. 12.

In FIGS. 10 and 11 in each of which the equal current distribution to the coils of the two phases is made, although a sine wave command value is given, no sine wave was obtained as a current value.

In FIGS. 12 and 13 in each of which the unequal current distribution to the coils of the two phases is made, the timing when the dead zone occurs differs among the current waveforms of the phases U and V. At the timing surrounded by a dotted line in FIG. 12, with respect to the sine wave superimposition command value, no sine wave is obtained by the phase U entering the dead zone; however, a sine wave-shaped current value is obtained by the phase V not entering the dead zone.

Also, FIGS. 12 and 13 show a sine wave signal intensity which serves as an indicator for determining whether a sine wave is clearly superimposed or not, does not fall close to 0, and a certain amount of sine wave is superimposed. The sine wave is composed of superimposed sine waves of 270 Hz and 20 Hz.

Accordingly, when the sine wave is not superimposed on the current waveform when, as the condition 1, the switches of the n phases are operated at different phases and when the switches of the n phases are operated at the same duty ratio, it can be determined that the currents flowing through the coils have entered the dead zone. That is, it can be determined whether or not the currents flowing through the coils have entered the dead zone, by determining whether the sine wave is superimposed on the current waveform or not when the switches of the n phases are operated at different phases and when the switches of the n phases are operated at the same duty ratio.

Figure 14:
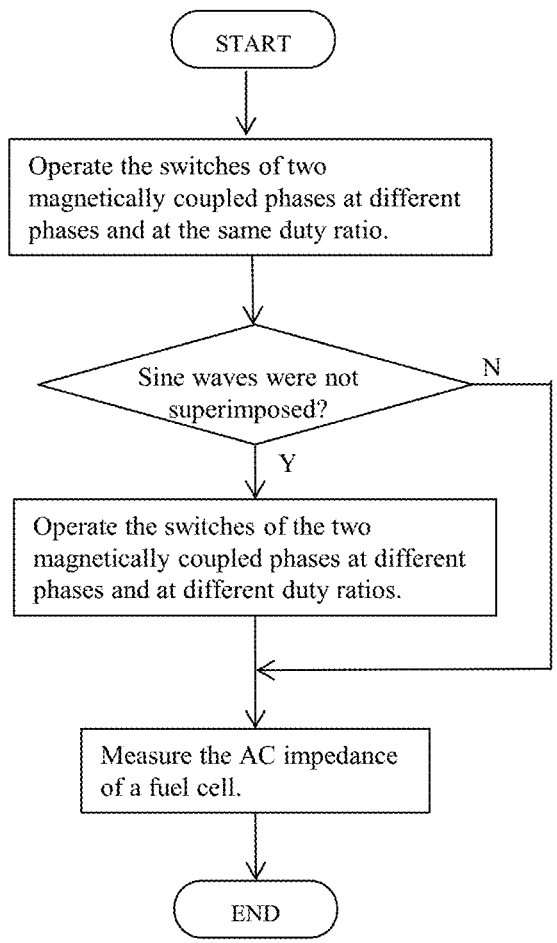
FIG. 14 is a flowchart of another example of control when AC impedance measurement of a fuel cell is carried out in a fuel cell system including a converter that includes a two-phase magnetically coupled reactor.

FIG. 14 is a flowchart of another example of control when AC impedance measurement of a fuel cell is carried out in a fuel cell system including a converter that includes a two-phase magnetically coupled reactor.

FIG. 14 is a variation of the pattern A. The controller operates the switches of the two phases at different phases and at the same duty ratio. Then, the controller determines whether or not the condition 1 is met. When the sine wave is not superimposed on the current waveform, the controller determines that the condition 1 is met, and the controller changes the operation of the switches of the two phases from the operation of the switches at different phase and at the same duty ratio to the operation of the switches at different phases and at different duty ratios. Then, AC impedance measurement of the fuel cell is carried out. On the other hand, when the sine wave is superimposed on the current waveform, the controller determines that the condition 1 is not met, and the controller operates the switches of the two phases at different phases and at the same duty ratio. Then, AC impedance measurement of the fuel cell is carried out.

The determination as to whether or not the sine wave is superimposed on the current waveform, may be made by the following method: when
the duty ratio is increased and decreased so that the amplitude of the current value of the coil is the normal amplitude of the current value (a target current amplitude value A), the amplitude of the current value of the measured (actual) coil is smaller than an expected value (the target current amplitude value A), it is determined that the sine wave is not superimposed on the current waveform.

Figure 15:
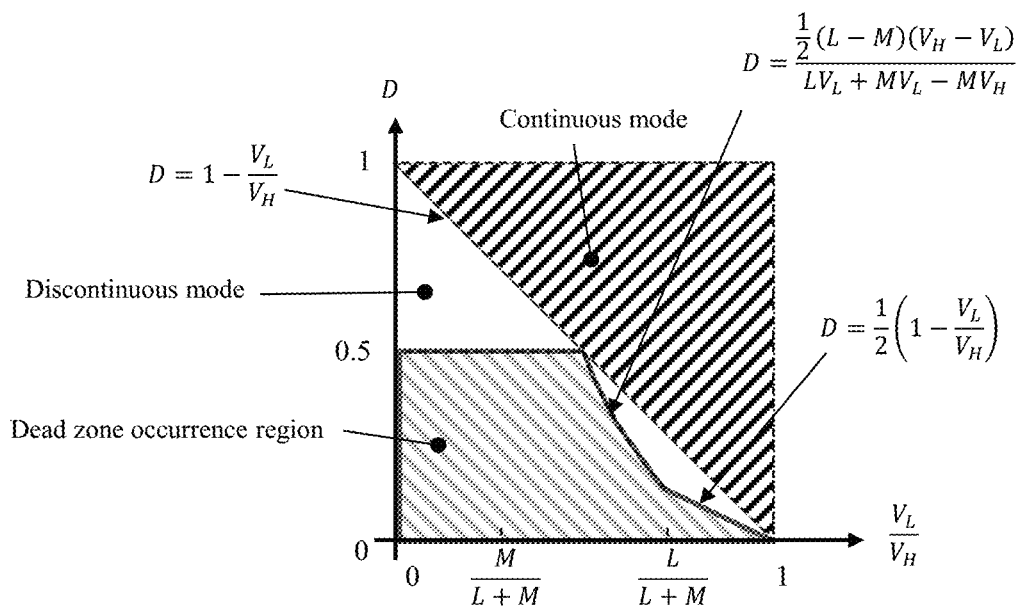
FIG. 15 is a diagram showing the dead zone occurrence region in a discontinuous mode.

FIG. 15 is a diagram showing a dead zone occurrence region in a discontinuous mode.

For a step-up converter in which (every) two phases are magnetically coupled and L is larger than M (L>M), it was found that the region where the condition 1 is met and the dead zone occurs, is a region which is marked with diagonal lines as the dead zone occurrence region.

L is the self-inductance of the reactor, and M is the mutual inductance of the reactor. They are inherent values determined by the physical values of the reactor. $V_L$ is the inlet voltage of the step-up converter (the voltage before step-up), and $V_H$ is the outlet voltage (the voltage after step-up) of the step-up converter.

When two phases are magnetically coupled (n=2), the two phases may be operated at different phases, and they may be operated at a phase difference of 180°. When the two phases are operated at different phases, as long as the currents are in the discontinuous mode and the duty ratios are less than 50% (D<0.5), the step-up converter operating condition becomes the operating condition in which when the average current value of the coil of one of the magnetically coupled phases is kept at 0, the switch of the other phase is switched from ON to OFF.

From the viewpoint of accurately determining the operating condition in which the dead zone occurs, when two phases are magnetically coupled (n=2), the controller may determine that the condition 1 is met, when it determines that the following condition of the dead zone occurrence region shown in FIG. 15 is met:

The condition 1 is met when the switches of the two magnetically coupled phases are operated at a phase difference of 180°, and when the currents flowing through the coils are in the discontinuous mode and the duty ratios (D) of the switches of the two phases are less than 50% (D<0.5) and satisfy any one of the following formulae (A) and (B):

$$D < \{(1/2)(L-M)(V_H-V_L)\}/(LV_L+MV_L-MV_H) \quad \text{Formula (A)}$$

$$D < (1/2)\{1-(V_L/V_H)\} \quad \text{Formula (B)}$$

where L is the self-inductance of the reactor; M is the mutual inductance of the reactor; $V_H$ is the outlet voltage of the converter; $V_L$ is the inlet voltage of the converter; and D is the duty ratio (-).

When (every) two phases are magnetically coupled, a part of the condition 1 is that "when the switches of the two magnetically coupled phases are operated at a phase difference of 180°, the currents flowing through the coils are in the discontinuous mode and the duty ratios (D) of the switches of the two phases are less than 50% (D<0.5)".

Meanwhile, when (every) n phases are magnetically coupled, and the n magnetically coupled phases are operated at a phase difference of (360°/n), the condition 1 is "when the switches of the n magnetically coupled phases are operated at a phase difference of (360°/n), the currents flowing through the coils are in the discontinuous mode and the duty ratios (D) of the switches of the n phases are less than (100−100/n) %", in place of "when the switches of the two magnetically coupled phases are operated at a phase difference of 180°, the currents flowing through the coils are in the discontinuous mode and the duty ratios (D) of the switches of the two phases are less than 50% (D<0.5)".

EXAMPLES

When two phases are magnetically coupled (n=2), the controller may determine that the condition 1 is met, when it determines that "when the switches of the two magnetically coupled phases are operated at a phase difference of 180°, the currents flowing through the coils are in the discontinuous mode and the duty ratios of the switches of the two phases are less than 50% (D<0.5) and satisfy any one of the formulae (A) and (B)".

Figure 16:
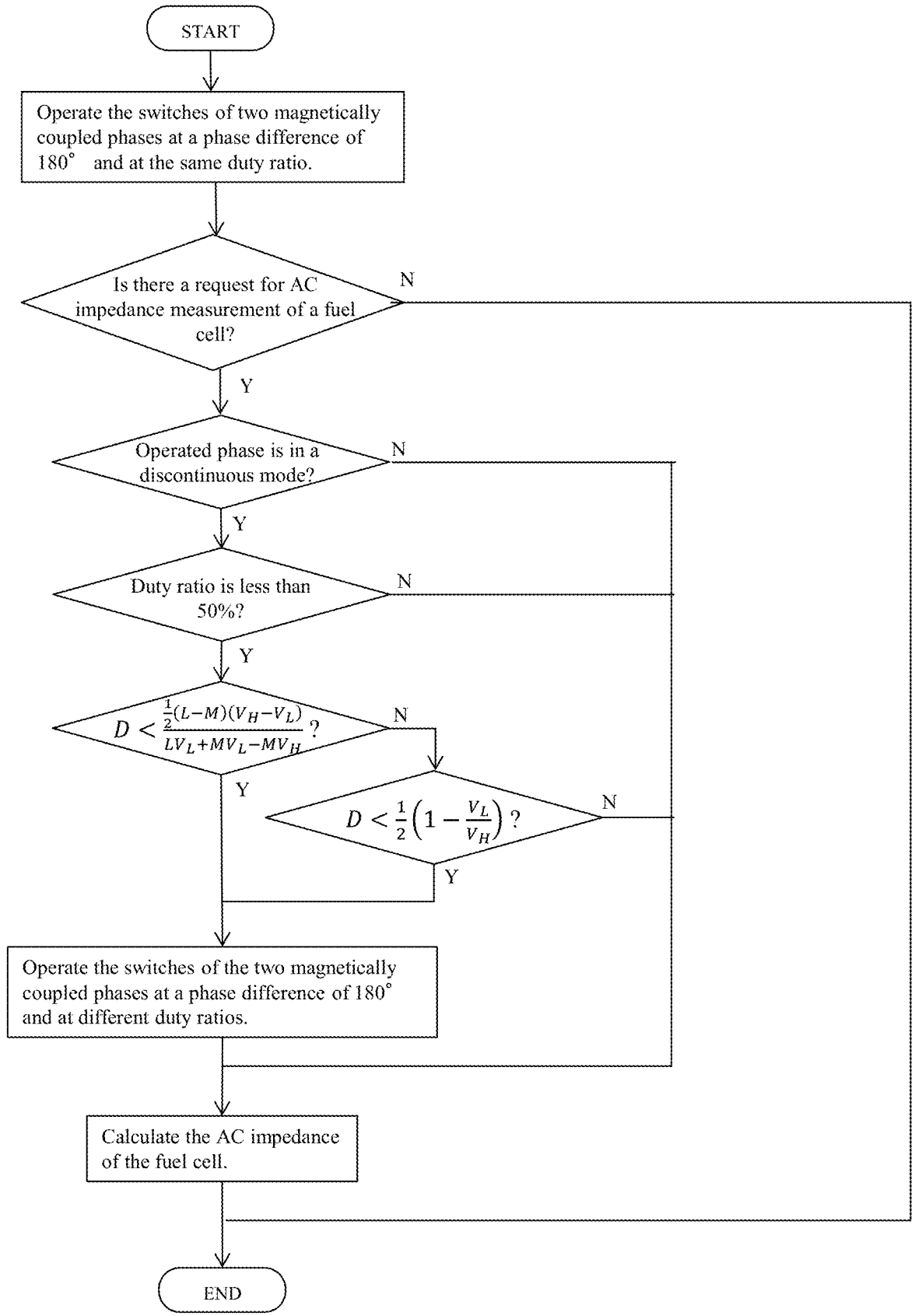
FIG. 16 is a flowchart of another example of control when AC impedance measurement of a fuel cell is carried out in a fuel cell system including a converter that includes a two-phase magnetically coupled reactor.

FIG. 16 is a flowchart of another example of control when AC impedance measurement of a fuel cell is carried out in a fuel cell system including a converter that includes a two-phase magnetically coupled reactor.

The controller determines whether or not there is a request for AC impedance measurement of the fuel cell, by operating the switches of the two phases at a phase different of 180° and at the same duty ratio. When the controller determines that there is no request for AC impedance measurement of the fuel cell, the controller ends the control. On the other hand, when the controller determines that there is a request for AC impedance measurement of the fuel cell, the controller monitors the current values of the coils, and as the condition 1, the controller determines whether or not "the currents flowing through the coils (the operated phases) are in the discontinuous mode and the duty ratios (D) of the switches of the two phases are less than 50% (D<0.5) and satisfy any one of the formulae (A) and (B), when the switches of the two magnetically coupled phases are operated at a phase difference of 180°". When the controller determines that the condition 1 is not met, the controller operates the switches of the two phases at a phase difference of 180° and at the same duty ratio, and then the controller measures the AC impedance of the fuel cell. On the other hand, when the controller determines that the condition 1 is met, the controller changes the operation of the switches of the two phases from the operation of the switches at a phase difference of 180° and at the same duty ratio to the operation of the switches at a phase difference of 180° and at different duty ratios. Then, the controller measures the AC impedance of the fuel cell.

As shown in FIG. 15, "the dead zone occurrence region" is the time "when the currents flowing through the coils are in the discontinuous mode, when the duty ratios (D) of the switches of the two phases are less than 50% (D<0.5), and when any one of the formulae (A) and (B) is satisfied". Accordingly, for example, at the timing when the operating condition moves to the dead zone occurrence region shown in FIG. 15, the operation of the switches of the two phases may be changed from the operation of the switches at a phase difference of 180° and at the same duty ratio to the operation of the switches at a phase difference of 180° and at different duty ratios.

The method for determining whether or not the dead zone occurrence condition 1 is met, is not limited to the above. For example, depending on the input voltage, output voltage and duty ratio, the range corresponding to the dead zone is defined, and when it is shown that at the predetermined output voltage, the input voltage and the duty ratio have entered or come close to the range corresponding to the dead zone, the controller may determine that the condition 1 is met.

As described above, the range corresponding to the dead zone is preliminarily defined. When the input voltage and the duty ratio enter the range, the operation of the switches of the two phases is changed from the operation of the switches at a phase difference of 180° and at the same duty ratio to the operation of the switches at a phase difference of 180° and at different duty ratios. Accordingly, the AC impedance of the fuel cell can be immediately acquired when it is needed.

In FIG. 16, the condition 1 is defined as follows: "when the switches of the two magnetically coupled phases are operated at a phase difference of 180°, the currents flowing through the coils are in the discontinuous mode and the duty ratios of the switches of the two phases are less than 50% and satisfy any one of the formulae (A) and (B)". However, the condition "when the duty ratios of the switches of the two phases satisfy any one of the formulae (A) and (B)" may be excluded from the condition 1.

That is, the condition 1 may be as follows: "when the switches of the two magnetically coupled phases are operated at a phase difference of 180°, the currents flowing through the coils are in the discontinuous mode, and the duty ratios of the switches of the two phases are less than 50%". In this case, for example, at the timing when the output requested to the fuel cell is decreased and when the condition moves from the condition in which the currents flowing through the coils are in the discontinuous mode and the duty ratios of the switches of the two phases are 50% or more, to the condition in which the currents flowing through the coils are in the discontinuous mode, and the duty ratios of the switches of the two phases are less than 50%, the operation of the switches of the two phases may be changed from the operation of the switches at a phase difference of 180° and at the same duty ratio to the operation of the switches at a phase difference of 180° and at difference duty ratios.

As shown in FIG. 15, the region excluded by the formulae (A) and (B) from the range in which the same duty ratio is changed to different duty ratios, is not large. Accordingly, even when the condition "when the duty ratios of the switches of the two phases satisfy any one of the formulae (A) and (B)" is excluded, it is thought that there is a limited influence on the increase of battery lifetime. Meanwhile, by excluding the condition "when the duty ratios of the switches of the two phases satisfy any one of the formulae (A) and (B)", the control can be simplified, and the AC impedance of the fuel cell can be appropriately measured.

Another variation of the condition 1 may be as follows: "when the switches of the two magnetically coupled phases are operated at a phase difference of 180°, the currents flowing through the coils are in the discontinuous mode, and the duty ratios of the switches of the two phases are less than 50% and satisfy the formula (A)" or "when the switches of the two magnetically coupled phases are operated at a phase difference of 180°, the currents flowing through the coils are in the discontinuous mode, and the duty ratios of the switches of the two phases are less than 50% and satisfy the formula (B)".

[AC Impedance Measurement]

The controller measures the AC impedance of the fuel cell from the current waveform and voltage waveform of the fuel cell.

The controller may confirm whether or not there is a request for AC impedance measurement of the fuel cell. When the controller confirms that there is a request for AC impedance measurement of the fuel cell, the controller may determine whether or not the condition 1 is met. When the controller determines that the condition 1 is met, the controller may operate the switches of the n phases at different duty ratios and may measure the AC impedance of the fuel cell.

When the controller determines that the condition 1 is met, the controller may confirm whether or not there is a request for AC impedance measurement of the fuel cell. When the controller confirms that there is a request for AC impedance measurement of the fuel cell, the controller may operate the switches of the n phases at different duty ratios and may measure the AC impedance of the fuel cell.

To perceive the state of the electrolyte membrane of the fuel cell and the condition of gas supply, the controller measures the AC impedance of the fuel cell at a predetermined frequency during the operation of the fuel cell.

The controller switches the PWM duty ratios of the converter, while it periodically increases and decreases the PWM duty ratios; the output voltage and output current value of the fuel cell when a load current containing a certain frequency component is applied, are acquired as time-series waveform data of one wavelength or more; the waveform data is subjected to the discrete Fourier transform; and the discrete Fourier transform result of the voltage signal is divided by the discrete Fourier transform result of the current signal, thereby calculating the AC impedance of the fuel cell.

In the low load region referred to as the "discontinuous mode", as the duty ratios increase, the average current values flowing through the coils of the reactor also increases.

To acquire the AC impedance of the fuel cell, the duty ratios may be controlled so that the amplitude of the output current becomes a sine wave of about ±3 A.

As the output voltage value of the fuel cell, the voltage of the whole fuel cell stack may be acquired, or the voltage of each unit cell may be acquired. By use of the voltage value of the whole fuel cell stack, the AC impedance of the whole fuel cell stack is obtained. By use of the voltage value of each unit cell, the AC impedance of each unit cell is obtained.

By acquiring the voltage of every few unit cells (such as every two unit cells and every four unit cells), the AC impedance of every unit cell block is acquired.

When the unit cell area is approximately several hundreds of $cm^2$, the component of 200 Hz or more of the AC impedance acquired during power generation, mainly represents the proton transfer resistance and contact resistance of the electrolyte membrane, and a component of several tens of Hz represents gas diffusion resistance.

In the disclosed embodiments, the method for measuring the AC impedance of the fuel cell is not particularly limited. A commonly-known method may be used, such as the method described in JP-A No. 2008-098134.

REFERENCE SIGNS LIST

10: Fuel cell
20: Step-up converter

21: Reactor
22: Current sensor
23: Switch
24: Diode
25: Capacitor
50: External load

The invention claimed is:

1. A fuel cell system,
wherein the fuel cell system comprises a fuel cell and a converter for carrying out at least one selected from the group consisting of step-up and step-down of output voltage of the fuel cell;
wherein the converter comprises:
  a reactor comprising coils of n phases where n is an integer of 2 or more, which are magnetically coupled to each other,
  switches of the n phases, which are connected to the coils, and
  a controller;
wherein the controller controls ON and OFF of the switches of the n phases;
wherein the controller monitors current values of the coils;
wherein the controller measures an AC impedance of the fuel cell from a current waveform of and a voltage waveform of the fuel cell;
wherein the controller operates the switches of the n phases at different phases, and the controller operates the switches of the n phases at a same duty ratio;
wherein the controller operates the switches of the n phases at different duty ratios, when the controller determines that the following condition 1 is met:
condition 1: an operating condition in which, when the switches of the n phases are operated at different phases, and when currents flowing through the coils are in a discontinuous mode and a current value flowing through the coil of one of the n phases is kept at zero, the switch connected to the coil of at least one of the remaining phases is switched from ON to OFF.

2. The fuel cell system according to claim 1, wherein the controller operates the switches of the n phases at a phase difference of $(360/n)°$.

3. The fuel cell system according to claim 1,
wherein the controller sets an offset current value y, which is added to or subtracted from each of command current values of the magnetically coupled coils of the n phases, to 25% to 75% of a dead zone current interval so that target current values of the magnetically coupled coils of the n phases are different from each other, and
wherein the controller unequally distributes the target current values so that the target current values of the coils, which are obtained by adding or subtracting the offset current value y to or from the command current values, are different from each other, and the controller operates the switches at different duty ratios.

4. The fuel cell system according to claim 3,
wherein the controller preliminarily stores a current distribution difference map derived from a relationship between inlet voltage of the converter, outlet voltage of the converter, and current values flowing through the coils of the reactor, and
wherein, based on the current distribution difference map, the controller unequally distributes the target current values so that the target current values of the coils are different from each other, and the controller operates the switches at different duty ratios.

5. The fuel cell system according to claim 1,
wherein the controller preliminarily stores an operating condition of the converter, which corresponds to the condition 1, as a data group, and
wherein, by comparing a latest operating condition of the converter with the data group, the controller determines whether or not the condition 1 is met.

6. The fuel cell system according to claim 1,
wherein, when n is 2 (n=2) and the switches of the two magnetically coupled phases are operated at a phase difference of 180°, the controller determines that the condition 1 is met when the currents flowing through the coils are in the discontinuous mode and the duty ratios of the switches of the two phases are less than 50% (D<0.5) and satisfy any one of the following formulae (A) and (B):

$$D<\{(1/2)(L-M)(V_H-V_L)\}/(LV_L+MV_L-MV_H) \quad \text{Formula (A)}$$

$$D<(1/2)\{1-(V_L/V_H)\} \quad \text{Formula (B)}$$

where L is self-inductance of the reactor; M is mutual inductance of the reactor; $V_H$ is the outlet voltage of the converter; $V_L$ is the inlet voltage of the converter; and D is the duty ratio (–).

7. The fuel cell system according to claim 1,
wherein the controller confirms whether or not there is a request for AC impedance measurement of the fuel cell;
wherein, when the controller confirms that there is a request for AC impedance measurement of the fuel cell, the controller determines whether or not the condition 1 is met; and
wherein, when the controller determines that the condition 1 is met, the controller operates the switches of the n phases at different duty ratios and measures the AC impedance of the fuel cell.

* * * * *